(12) United States Patent
Sasaki et al.

(10) Patent No.: US 10,541,158 B2
(45) Date of Patent: Jan. 21, 2020

(54) TEMPERATURE ADJUSTMENT METHOD USING WET SURFACE IN A PROCESSING CHAMBER

(71) Applicant: TOKYO ELECTRON LIMITED, Tokyo (JP)

(72) Inventors: Yasuharu Sasaki, Nirasaki (JP); Eiichiro Kikuchi, Nirasaki (JP); Kazuyoshi Matsuzaki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 251 days.

(21) Appl. No.: 15/656,328

(22) Filed: Jul. 21, 2017

(65) Prior Publication Data

US 2017/0323811 A1    Nov. 9, 2017

Related U.S. Application Data

(62) Division of application No. 13/213,234, filed on Aug. 19, 2011, now abandoned.
(Continued)

(30) Foreign Application Priority Data

Aug. 20, 2010    (JP) ................. 2010-184996

(51) Int. Cl.
*H01L 21/67*    (2006.01)

(52) U.S. Cl.
CPC .............. *H01L 21/67109* (2013.01)

(58) Field of Classification Search
CPC ....... C23C 16/00; C23C 16/46; C23C 16/463; C23F 1/08; F28D 5/00; H01L 21/67098
See application file for complete search history.

(56) References Cited

U.S. PATENT DOCUMENTS

| 5,126,571 A | 6/1992 | Sakai |
| H0001145 H | 3/1993 | Anderson |

(Continued)

FOREIGN PATENT DOCUMENTS

| CN | 2627561 Y | 7/2004 |
| CN | 1632161 A * | 6/2005 |

(Continued)

OTHER PUBLICATIONS

Huang, Peng, et al., "A Design Method to Improve Temperature Uniformity on Wafer for Rapid Thermal Processing". Electronics, 2018, 7, 213, pp. 1-8.*

(Continued)

*Primary Examiner* — Bret P Chen
(74) *Attorney, Agent, or Firm* — Cantor Colburn LLP

(57) ABSTRACT

A temperature adjustment method comprising: forming a wet surface wet with a cooling medium by supplying the cooling medium to a rear surface of a temperature adjustment surface of a component member in a processing chamber of a substrate processing device comprising the processing chamber which performs predetermined processing on a substrate and is vacuum-exhaustible; and adjusting a temperature of the temperature adjustment surface due to latent heat of evaporation of the cooling medium by evaporating the cooling medium which forms the wet surface by adjusting a pressure in an evaporation chamber which isolates the wet surface from an atmosphere around the wet surface.

3 Claims, 7 Drawing Sheets

Related U.S. Application Data

(60) Provisional application No. 61/382,545, filed on Sep. 14, 2010.

(56) References Cited

U.S. PATENT DOCUMENTS

| | | | |
|---|---|---|---|
| 6,015,465 | A | 1/2000 | Kholodenko et al. |
| 6,359,264 | B1 | 3/2002 | Schaper et al. |
| 6,534,750 | B1 | 3/2003 | Tanoue et al. |
| 2003/0177771 | A1* | 9/2003 | Maisotsenko ............. F28D 5/00 62/121 |
| 2005/0092013 | A1* | 5/2005 | Emoto ................ G03F 7/70691 62/304 |
| 2007/0037292 | A1* | 2/2007 | Kojima .................... G01N 1/32 436/174 |
| 2007/0081294 | A1* | 4/2007 | Buchberger, Jr. ............................ H01L 21/67109 361/234 |
| 2008/0023448 | A1 | 1/2008 | Tandou et al. |
| 2010/0055927 | A1* | 3/2010 | Hirose ................. C23C 16/345 438/791 |
| 2012/0016508 | A1 | 1/2012 | Matsuzaki et al. |
| 2012/0204576 | A1 | 8/2012 | Matsuzaki et al. |

FOREIGN PATENT DOCUMENTS

| | | | |
|---|---|---|---|
| CN | 101162133 A | 4/2008 | |
| CN | 101414546 A | 4/2009 | |
| EP | 2799589 A1 * | 11/2014 | ............. C23C 14/02 |
| JP | 03004927 | 1/1991 | |
| JP | 0348853 | 5/1991 | |
| JP | 03192644 | 8/1991 | |
| JP | 10284382 | 10/1998 | |
| JP | 2005079539 | 3/2005 | |
| JP | 2005109375 | 4/2005 | |
| JP | 2006005364 | 1/2006 | |
| WO | 2010113875 | 10/2010 | |

OTHER PUBLICATIONS

Hanks, Daniel F., et al., "Nanoporous membrane device for ultra high heat flux thermal management". Microsystems & Nanoengineering (2018)4:1, pp. 1-10.*

Battaglin, Felipe, et al., "Innovative Low Temperature Plasma Approach for Deposition of Alumina Films". Materials Research, 2014; 17(6), pp. 1410-1419.*

* cited by examiner

TEMPERATURE ADJUSTMENT METHOD USING WET SURFACE IN A PROCESSING CHAMBER

CROSS-REFERENCE TO RELATED PATENT APPLICATIONS

This application is a divisional application of U.S. application Ser. No. 13/213,234 (now abandoned), filed on Aug. 19, 2011, which claims priority to and the benefit of Japanese Patent Application No. 2010-184996, filed on Aug. 20, 2010, in the Japanese Patent Office, and U.S. Patent Application No. 61/382,545, filed on Sep. 14, 2010, in the United States Patent and Trademark Office, the entire contents of which are incorporated herein by reference.

BACKGROUND OF THE INVENTION

1 Field of the Invention

The present invention relates to a substrate processing apparatus including a temperature adjustment unit for adjusting a temperature of a surface of a component member in a processing chamber and a temperature adjustment method of adjusting the temperature of the surface of the component member in the processing chamber of the substrate processing apparatus.

2. Description of the Related Art

A substrate processing apparatus for performing predetermined processing on various substrates including a semiconductor wafer includes, for example, a processing chamber which is vacuum-exhaustible, a substrate holding stage (susceptor) on which a substrate is held in the processing chamber, and a shower head which faces the substrate holding stage with a processing space therebetween, generates plasma from a process gas due to high frequency power applied to any one of the susceptor and the shower head, and performs plasma processing such as etching, film formation, or the like, on the substrate by using the generated plasma.

In such a substrate processing apparatus, temperatures of the substrate and the susceptor on which the substrate is held are adjusted, for example, as follows. That is, a cooling medium passage, for example, having an annular shape and extending in a circumferential direction is provided in the susceptor and a low temperature cooling medium is circulated in the cooling medium passage through, for example, a pipe for the cooling medium from a chiller unit so that the susceptor cooled by the circulated cooling medium cools the substrate through, for example, an electrostatic chuck (ESC), thereby processing heat input from plasma or the like.

Also, recently, a substrate processing apparatus for cooling by using evaporation heat (hereinafter, latent heat of evaporation) of a cooling medium which is circulated in a cooling medium passage has been suggested (for example, refer to Patent Document 1).

However, in a substrate processing apparatus using a temperature adjustment method of circulating a cooling medium, if an amount of heat input due to plasma or the like is high, since a temperature of the cooling medium should be further reduced and an amount of the cooling medium circulated should be increased, a wide installation space for installing a temperature adjustment unit having great cooling performance is needed. Also, since a lower space inside the susceptor is limited, there is a case where the temperature adjustment unit cannot be installed in the substrate processing apparatus.

Also, in a substrate processing apparatus including a cooling unit using latent heat of evaporation of a cooling medium, since a circulation line, a compressor, a condenser, an expansion valve, and so on only for the cooling unit are needed, a configuration of the apparatus is complicated.

[Patent Document 1] Japanese Laid-Open Patent Publication No. 2005-079539

SUMMARY OF THE INVENTION

To solve the above and/or other problems, the present invention provides a substrate processing apparatus including a temperature adjustment unit which can reduce an installation space and simplify a configuration of the apparatus, and a temperature adjustment method of adjusting a temperature of a component member in a processing chamber in the substrate processing apparatus.

According to an aspect of the present invention, there is provided a substrate processing apparatus including: a processing chamber in which predetermined processing is performed on a substrate and which is vacuum-exhaustible; a wet surface forming device which forms a surface wet with a cooling medium on a rear surface of a temperature adjustment surface of a component member in the processing chamber; an evaporation chamber which isolates the wet surface from an atmosphere around the wet surface; and a pressure adjustment device which adjusts a pressure in the evaporation chamber, wherein the pressure in the evaporation chamber is adjusted by using the pressure adjustment device such that the cooling medium which forms the wet surface is evaporated, thereby controlling a temperature of the temperature adjustment surface due to latent heat of evaporation of the cooling medium.

A plurality of the temperature adjustment surfaces may be present on a plurality of places of a surface of the component member, and the wet surface forming device, the evaporation chamber, and the pressure adjustment device may be provided on each of the plurality of temperature adjustment surfaces.

The pressure adjustment device may adjust the pressure in the evaporation chamber to a pressure lower than a saturated vapor pressure of the cooling medium.

A vapor discharge passage through which a vapor obtained by evaporating the cooling medium is discharged to the outside of the evaporation chamber may be connected to the evaporation chamber.

The wet surface forming device may be a cooling medium spray device which forms the wet surface by spraying the cooling medium to the rear surface of the temperature adjustment surface.

The wet surface forming device may include a cooling medium container in which at least a part of the rear surface of the temperature adjustment surface is immersed in the cooling medium, and form the wet surface by supplying the cooling medium to the rear surface of the temperature adjustment surface due to surface tension of the cooling medium.

The wet surface forming device may be a shower device which forms the wet surface by spraying the cooling medium to the rear surface of the temperature adjustment surface.

The wet surface forming device may have a porous film provided on the rear surface of the temperature adjustment surface and form the wet surface by supplying the cooling medium to the rear surface of the temperature adjustment surface through the porous film.

The component member in the processing chamber may be a substrate holding stage on which the substrate is held or a shower head which faces the substrate holding stages with a processing space therebetween.

The cooling medium may be water.

According to another aspect of the present invention, there is provided a temperature adjustment method including: forming a surface wet with a cooling medium by supplying the cooling medium to a rear surface of a temperature adjustment surface of a component member in a processing chamber of a substrate processing device including the processing chamber which performs predetermined processing on a substrate and is vacuum-exhaustible; and adjusting a temperature of the temperature adjustment surface due to latent heat of evaporation of the cooling medium by evaporating the cooling medium which forms the wet surface by adjusting a pressure in an evaporation chamber which isolates the wet surface from an atmosphere around the wet surface.

The forming of the wet surface may include controlling the temperature of the temperature adjustment surface based on the pressure in the evaporation chamber and/or an amount of the cooling medium supplied.

After the pressure in the evaporation chamber is set to a pressure lower than a saturated vapor pressure of the cooling medium, the amount of the cooling medium supplied is adjusted, thereby controlling the temperature of the temperature adjustment surface.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
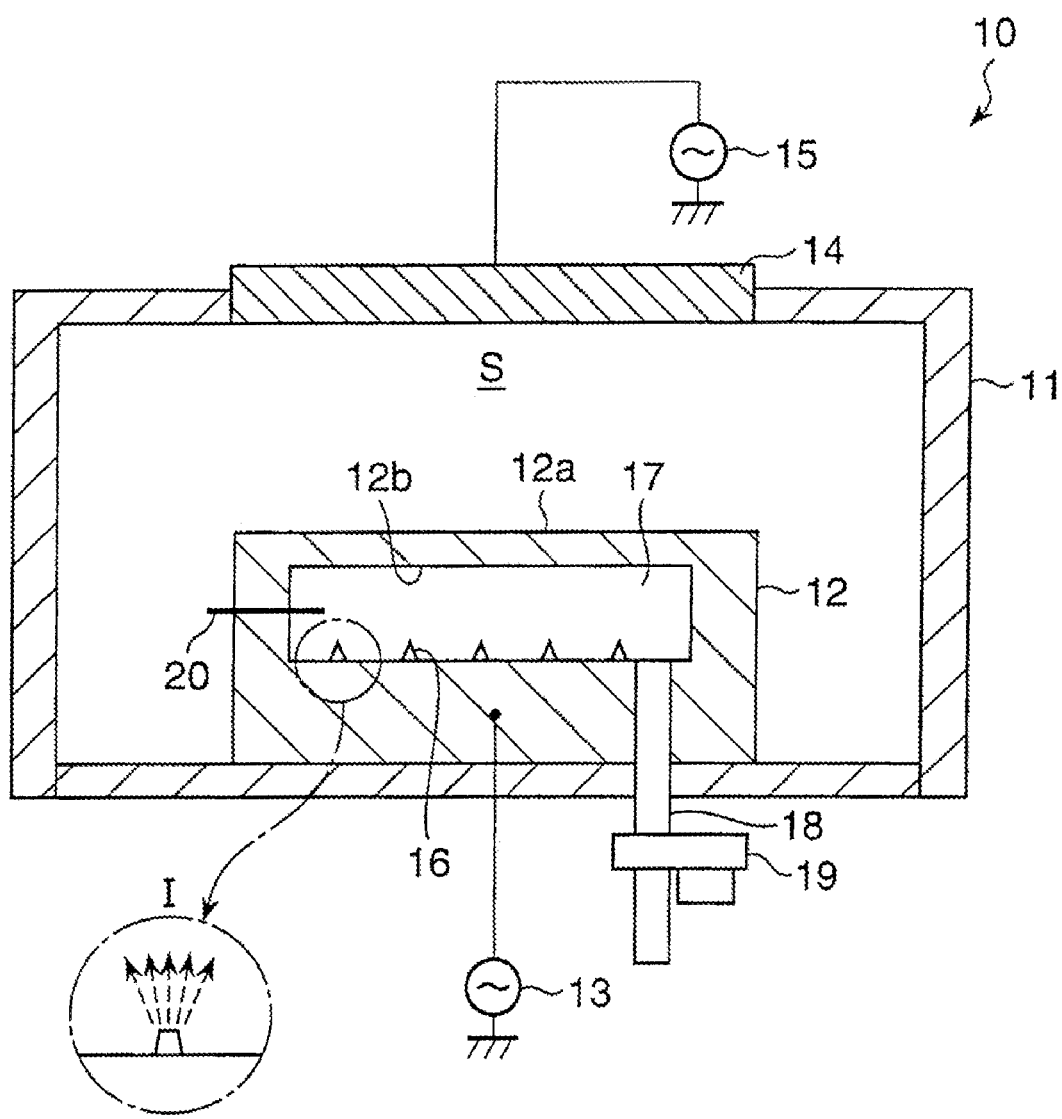
FIG. 1 is a cross-sectional view showing main parts of a substrate processing apparatus according to an embodiment of the present invention, and a partially enlarged view thereof.

FIG. 1 is a cross-sectional view showing main parts of a substrate processing apparatus 10 according to an embodiment of the present invention, and a partially enlarged view thereof.

Referring to FIG. 1, the substrate processing apparatus 10 includes a processing chamber (chamber) 11 which performs predetermined plasma processing such as etching, film formation, or the like, on a substrate and is vacuum-exhaustible. A substrate holding stage (susceptor) 12 is provided at a center of a lower portion in the chamber 11. The substrate is held on a top surface 12a of the susceptor 12. A first high frequency power source 13 is connected to the susceptor 12 with a first matcher (not shown) therebetween, and the first high frequency power source 13 applies high frequency power for bias of a relatively low frequency, for example, 2 MHz, to the susceptor 12. The susceptor 12 serves as a lower electrode.

A shower head 14 is disposed in a ceiling portion to face the susceptor 12 with a processing space S therebetween. A second high frequency power source 15 is connected to the shower head 14 with a second matcher (not shown) therebetween, and the second high frequency power source 15 applies high frequency power for plasma generation of a relatively high frequency, for example, 60 MHz, to the shower head 14. The shower head 14 serves as an upper electrode.

In the substrate processing apparatus 10, the top surface 12a of the susceptor 12, as a component member in the chamber, is a temperature adjustment surface. That is, in the chamber 11, when predetermined plasma processing is performed on the substrate (not shown), the substrate is heated due to heat input from plasma to, for example, 300° C. or higher. An optimal processing temperature of the substrate in plasma etching is, for example, about 40° C. Accordingly, the top surface 12a of the susceptor 12 is a temperature adjustment surface which needs to be cooled by using a temperature adjustment unit in order to reduce a temperature of the substrate to the optimal processing temperature.

Here, a temperature adjustment surface refers to a surface of a component member which is disposed in the chamber and whose surface temperature needs to be adjusted to a predetermined temperature for a substrate processing purpose. Also, the component member in the chamber is a broad concept including a member constituting an inner wall of the chamber 11.

A temperature adjustment device for adjusting a temperature of a temperature adjustment surface mainly includes: a plurality of water spray devices 16 which form a surface wet with a cooling medium, for example, a surface wet with water, on a rear surface 12b (hereinafter, referred to as a rear surface of the susceptor) which is a closest surface to the top surface 12a of the susceptor 12 (hereinafter, referred to as a surface of the susceptor); an evaporation chamber 17 which isolates the wet surface formed on the rear surface 12b of the susceptor 12 from an atmosphere around the wet surface; a manometer 20 which monitors a pressure in the evaporation chamber 17; and a pressure adjustment device which adjusts the pressure in the evaporation chamber 17. The pressure adjustment device includes an exhaust pipe 18 connected to the evaporation chamber 17, an exhaust pump (not shown)

connected to the exhaust pipe 18, and an APC valve 19 which controls the pressure in the evaporation chamber 17.

In the substrate processing apparatus 10 configured as described above, a temperature of the surface 12a of the susceptor 12 as a temperature adjustment surface is adjusted as follows.

That is, first, water is supplied as a cooling medium to the water spray devices 16 through a water supply pipe (not shown) from a water storage tank which contains the water, the water is upwardly sprayed as shown in a partially enlarged view I of FIG. 1 from the water spray devices 16, and a surface wet with the water of a cooling medium is formed on the rear surface 12b of the susceptor 12.

In this case, an amount of the water sprayed is large enough to form a uniformly thin water film over the entire rear surface 12b of the susceptor 12. Also, at this time, an inside of the evaporation chamber 17 is depressurized by using the exhaust pump, and the pressure in the evaporation chamber 17 is adjusted to a pressure slightly lower than a saturated vapor pressure of the water by using the APC valve 19. Since the pressure in the evaporation chamber 17 is adjusted to a pressure slightly lower than the saturated vapor pressure of the water, the water on the wet surface formed on the rear surface 12b of the susceptor 12 is evaporated, heat corresponding to latent heat during evaporation of the water is removed at this time, and each of the rear surface 12b of the susceptor 12 and the surface 12a of the susceptor 12, which is a temperature adjustment surface, is cooled to a predetermined temperature.

An operation of each component member of the substrate processing apparatus 10 is controlled by a CPU of a control unit included in the substrate processing apparatus 10 according to a program corresponding to temperature adjustment process.

According to the present embodiment, since a surface wet with water as a cooling medium is formed on the rear surface 12b of the surface 12a of the susceptor 12 as a temperature adjustment surface and the water which forms the wet surface is evaporated by adjusting the pressure in the evaporation chamber 17, which isolates the wet surface from an atmosphere around the wet surface, to cool not only the rear surface 12b of the susceptor 12 but also the surface 12a of the susceptor 12 by using latent heat of evaporation of the water, a configuration of the apparatus can be simplified and an installation space can be reduced compared to a conventional temperature adjustment apparatus which circulates a cooling medium.

That is, according to the present embodiment, although a pipe for supplying water as a cooling medium is needed, since the supplied water is discharged as vapor to the outside of the evaporation chamber through the exhaust pipe 18, a pipe for discharging the water is not necessary. Accordingly, a temperature control device of a chiller and a heat-shielding structure of a coolant pipe, which are conventionally necessary, become unnecessary. Accordingly, the present embodiment can be widely applied from a substrate processing apparatus having a small installation space to a large substrate processing apparatus in which a temperature of a surface of a component member having a large area needs to be adjusted. In particular, the present embodiment is suitable for a substrate processing apparatus in which it is difficult to secure a circulation passage for a cooling medium.

In the present embodiment, the temperature of the surface 12a of the susceptor 12, which is a temperature adjustment surface, is controlled based on an amount of water supplied to the water spray devices 16 and the pressure in the evaporation chamber 17. Since latent heat of evaporation of the water is rarely changed due to pressure, the pressure in the evaporation chamber 17 may be a primary control condition and the amount of the water supplied to the water spray devices 16 may be a secondary control condition.

That is, a saturated vapor pressure of water at which the temperature of the surface 12a of the susceptor 12 is a desired temperature may be obtained, the pressure in the evaporation chamber 17 may be maintained at the saturated vapor pressure, and with respect to heat input which varies slightly such as heat input from plasma, an amount of the water supplied may be adjusted, thereby controlling the saturated vapor pressure to be maintained as long as possible. Also, with respect to a sudden input of heat, the pressure in the evaporation chamber 17 may be quickly reduced, thereby increasing an amount of the water evaporated.

In the present embodiment, if heat input from plasma in the susceptor 12 is processed or retrieved by using a temperature adjustment unit, latent heat of evaporation of water is, for example, 2257 kJ/kg, and the heat input from the plasma is A kJ/sec, the heat input from the plasma may be retrieved and processed by controlling evaporation of the water to be A/2257 kg/sec.

In the present embodiment, the temperature of the surface 12a of the susceptor 12, which is a temperature adjustment surface, may be adjusted to be within a range, for example, from 0° C. to 80° C., by using water at room temperature as a cooling medium.

Figure 2:
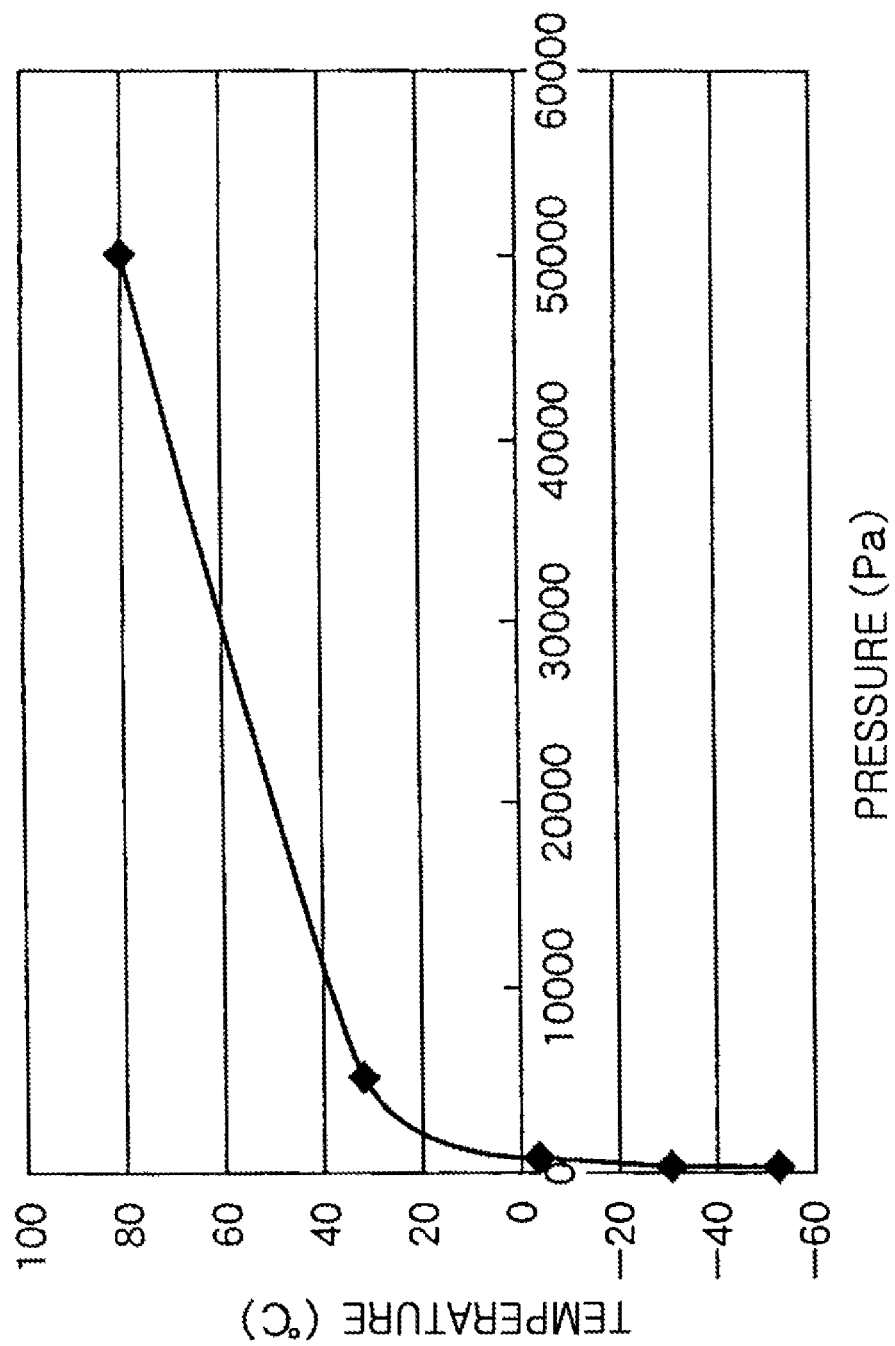
FIG. 2 is a graph showing a relationship between a pressure in an evaporation chamber and a temperature of a temperature adjustment surface in the present embodiment.

FIG. 2 is a graph showing a relationship between the pressure in the evaporation chamber 17 and the temperature of the surface 12a of the susceptor 12a in the present embodiment.

In FIG. 2, it is found that the temperature of the surface 12a of the susceptor 12 is about 10° C. when the pressure in the evaporation chamber 17 is reduced to 1230 Pa, and the temperature of the surface 12a of the susceptor 12 is about 0° C. when the pressure in the evaporation chamber 17 is reduced to 610 Pa from a state where the pressure in the evaporation chamber 17 is 50000 Pa and the temperature of the surface 12a of the susceptor 12 is adjusted to 80° C. Also, the temperature of the surface 12a of the susceptor 12 may be reduced to, for example, about −10° C. by setting each condition. In this case, since there is a risk that a water supply passage may be frozen, a heater for preventing freezing may be provided in the water supply passage.

In the present embodiment, an amount of heat which can be processed varies according to an amount of water supplied to the water spray devices 16, in other words, an amount of evaporated water.

Figure 3:
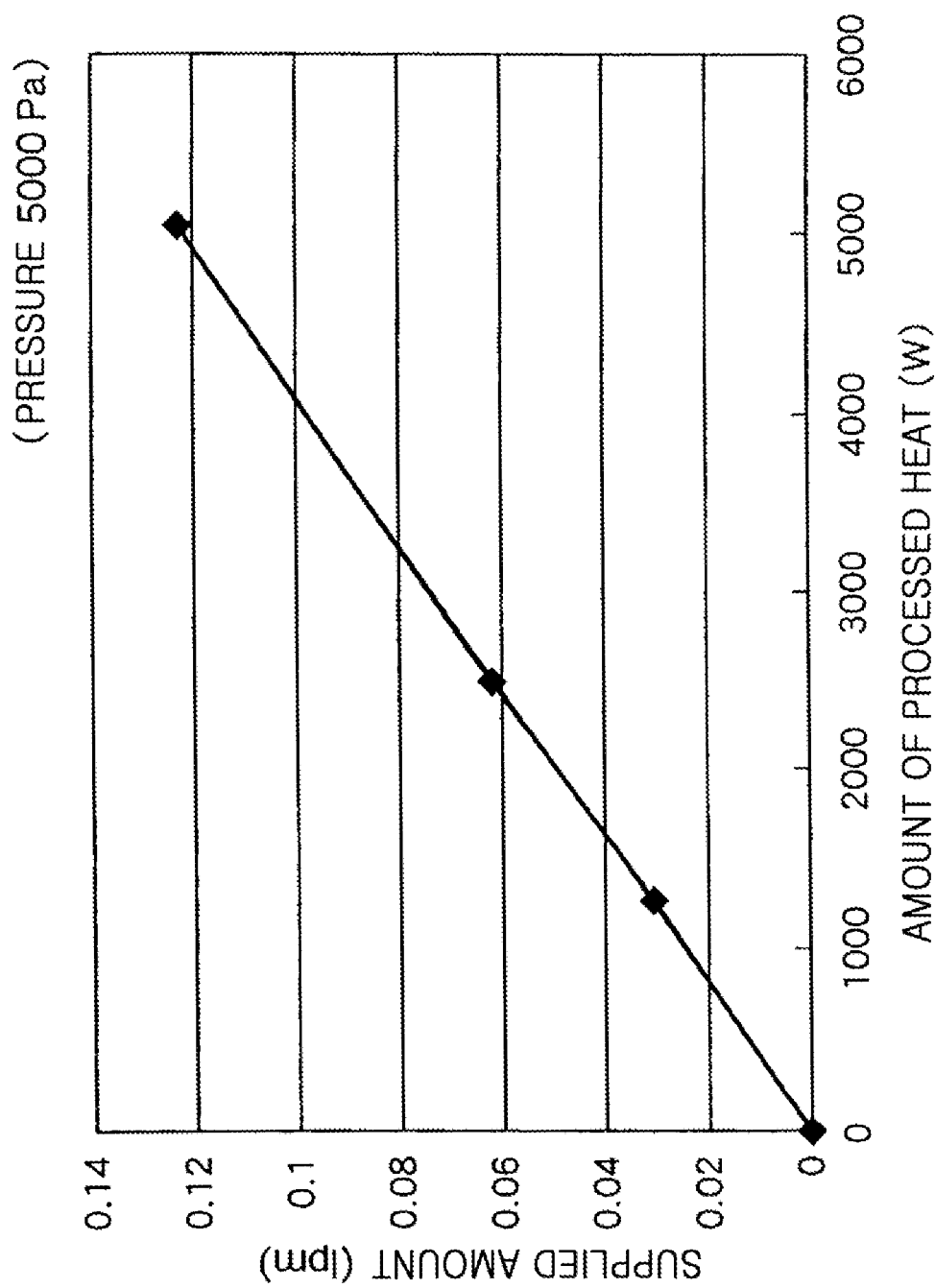
FIG. 3 is a graph showing a relationship between an amount of processed heat and an amount of a cooling medium supplied to a temperature adjustment unit in the present embodiment.

FIG. 3 is a graph showing a relationship between an amount of water supplied to the water spray devices 16 and an amount of processed heat in the present embodiment. Also, in FIG. 3, which is a graph showing a relationship between the amount of supplied water and the amount of processed heat when the pressure in the evaporation chamber 17 is 5000 Pa, it is found that the amount of processed heat is increased in proportion to the amount of supplied water (an amount of evaporated water).

In the present embodiment, a temperature of a surface of the susceptor 12 may be partially adjusted. That is, a central portion and a peripheral portion of the surface 12a of the susceptor 12 may be adjusted to different temperatures. In this case, wet surface forming devices, for example, the water spray devices 16, the evaporation chambers 17, and the pressure adjustment devices 18 and 19, are respectively provided on a portion of the rear surface 12b of the susceptor corresponding to the central portion of the surface 12a of the susceptor 12 and on a portion of the rear surface 12*b* of the susceptor 12 corresponding to the peripheral portion of the surface 12*a* of the susceptor 12, and are individually independently controlled to partially adjust the temperature of the surface 12*a* of the susceptor 12. There may be one or more predetermined portions which are temperature adjustment surfaces, and a wet surface forming device and a pressure adjustment device are provided on each temperature adjustment portion. Also, in the present embodiment, a surface temperature distribution of the susceptor 12 may be adjusted by changing a time of spraying water from the water spray devices on a temperature adjustment surface.

In the present embodiment, examples of component members in the chamber may include various members including the shower head 14, a deposition shield (not shown), a focus ring (not shown), and a shield ring (not shown) as well as the susceptor 12, and surfaces of these members may be temperature adjustment surfaces.

In the present embodiment, although a surface wet with water is formed on the rear surface 12*b* of the surface 12*a* of the susceptor 12, which is a temperature adjustment surface, there may be considered a case where it is difficult to form a wet surface on a rear surface of a component member. In this case, a surface wet with water may be formed on a surface closest to a temperature adjustment surface, for example, a side surface adjacent to a rear surface of the temperature adjustment surface.

In the present embodiment, although water which is optimal as a cooling medium is used a liquid having high latent heat of evaporation such as methanol or ammonia may be used instead of the water.

Next, modified examples of the substrate processing apparatus according to the present embodiment of the present invention will be explained.

Figure 4:
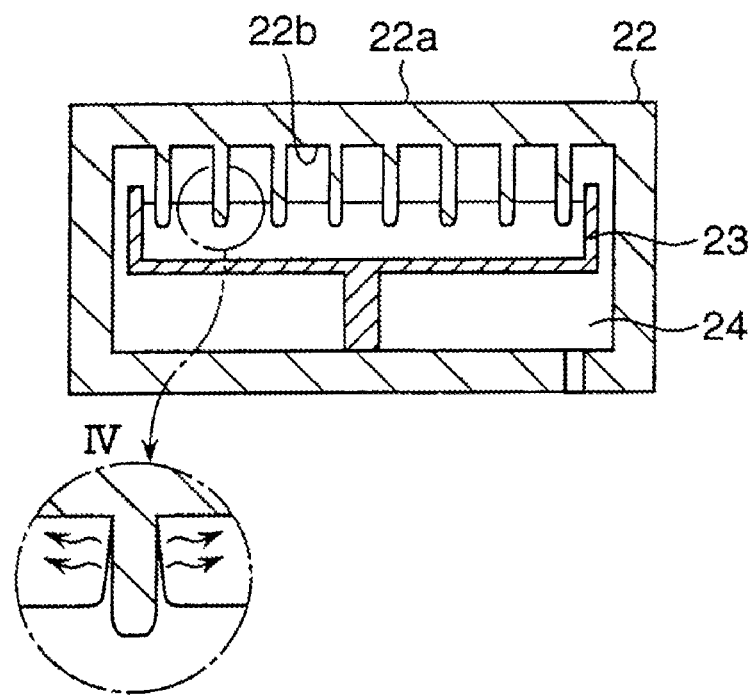
FIG. 4 is a cross-sectional view showing main parts of a first modified example of the substrate processing apparatus according to the present embodiment of the present invention, and a partially enlarged view thereof.

FIG. 4 is a cross-sectional view showing main parts of a first modified example of the substrate processing apparatus according to the present embodiment of the present invention, and a partially enlarged view thereof.

In FIG. 4, in the substrate processing apparatus, a rear surface 22*b* facing a surface 22*a* of a susceptor 22 is an uneven surface on which a plurality of convex portions are formed, an evaporation chamber 24 which isolates the uneven surface from an atmosphere around the uneven surface, and a water container 23 which is disposed in the evaporation chamber 24 is provided, the convex portions of the rear surface 22*b* of the susceptor 22 are partially immersed in the water container 23, and a wet surface is formed by supplying water as a cooling medium to the rear surface 22*b* of the susceptor 22 by using surface tension as shown in a partially enlarged view IV of FIG. 4. Then, in the same manner as that of the present embodiment, the surface 22*a* of the susceptor 22 is cooled by using latent heat of evaporation when the water which forms the wet surface is evaporated.

Even in the first modified example of the present embodiment, like in the present embodiment, since a temperature adjustment device which can reduce an installation space and simplify a configuration of the apparatus can be realized, a temperature of a temperature adjustment surface can be efficiently adjusted to a predetermined temperature. Also, in the first modified example of the present embodiment, a surface temperature distribution of the susceptor 22 may be adjusted by changing sparseness or denseness of the uneven surface on the temperature adjustment surface.

An experiment example using the first modified example of the present embodiment will be explained below.

When the substrate processing apparatus of FIG. 4 is used and there is heat input (not shown) from the surface 22*a* of the susceptor 22, an amount of water supplied to the water container 23 to maintain a temperature of the surface 22*a* of the susceptor 22 at 25° C. by using latent heat of evaporation of the water was examined. As a result, it was found that an amount of heat input from the surface 22*a* of the susceptor 22 and the amount of water supplied to the water container 23 have a good correlation.

Figure 5:
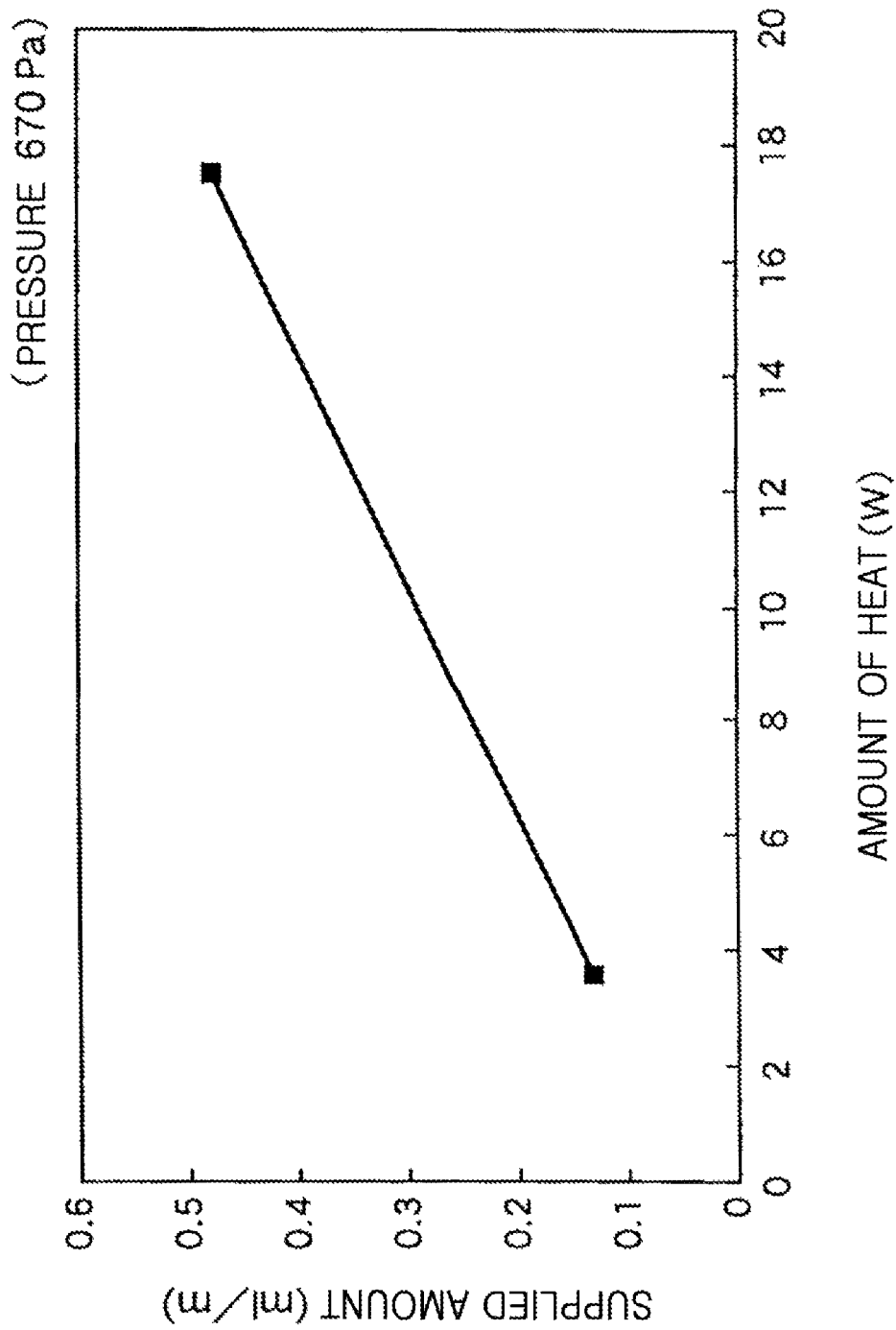
FIG. 5 is a graph showing a relationship between an amount of processed heat and an amount of water supplied to a water container in the first modified example of the substrate processing apparatus according to the present embodiment of the present invention.

FIG. 5 is a graph showing a relationship between an amount of heat input from the surface 22*a* of the susceptor 22 and an amount of water supplied to the water container 23 when a pressure in the chamber is 670 Pa.

In FIG. 5, as the amount of heat input from the surface 22*a* is increased, the amount of water supplied to the water container 23 is continuously increased. In such a substrate processing apparatus, if there is no change in the amount of heat input from the surface 22*a* of the susceptor 22 and the amount of water supplied to the water container 23 is maintained constant, the temperature of the surface 22*a* of the susceptor 22 can be maintained at 25° C. semi-permanently.

Another modified example of the substrate processing apparatus according to the present embodiment of the present invention will be explained.

Figure 6:
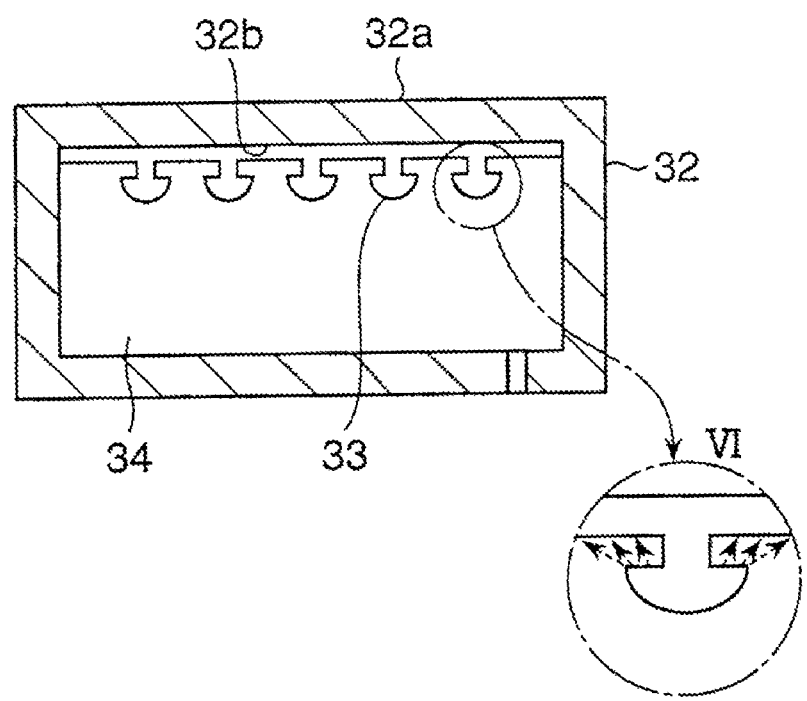
FIG. 6 is a cross-sectional view showing main parts of a second modified example of the substrate processing apparatus according to the present embodiment of the present invention, and a partially enlarged view thereof.

FIG. 6 is a cross-sectional view showing main parts of a second modified example of the substrate processing apparatus according to the present embodiment of the present invention, and a partially enlarged view thereof.

In FIG. 6, in the substrate processing apparatus, a plurality of shower devices 33 are provided in an evaporation chamber 34 which surrounds a rear surface 32*b* of a susceptor 32, a surface wet with water is formed on the rear surface 32*b* of the susceptor 32 as shown in a partially enlarged view VI of FIG. 6 by using the shower devices 33, and the water, as a cooling medium, which forms the wet surface is evaporated by adjusting a pressure in the evaporation chamber 34.

Even in the second modified example of the present embodiment, like in the present embodiment, due to a temperature adjustment device which can reduce an installation space and simplify a configuration of the apparatus, a temperature of a temperature adjustment surface can be efficiently adjusted.

Another modified example of the substrate processing apparatus according to the present embodiment of the present invention will be explained.

Figure 7:
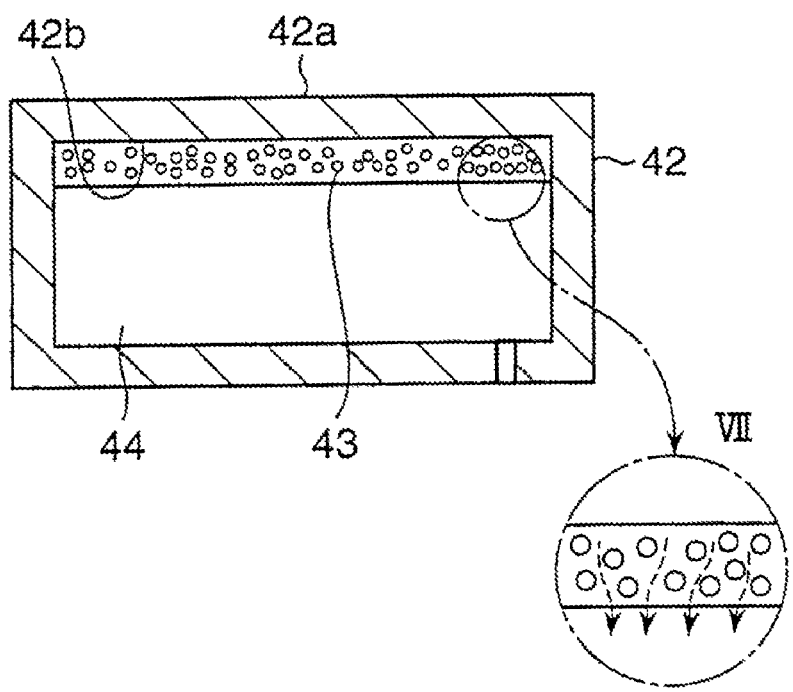
FIG. 7 is a cross-sectional view showing main parts of a third modified example of the substrate processing apparatus according to the present embodiment of the present invention, and a partially enlarged view thereof.

FIG. 7 is a cross-sectional view showing main parts of a third modified example of the substrate processing apparatus according to the present embodiment of the present invention, and a partially enlarged view thereof.

In FIG. 7, in the substrate processing apparatus, a porous layer 43 is disposed to contact a rear surface 42*b* of a susceptor 42, and water is supplied as a cooling medium from a water supply source (not shown) to the porous layer 43 to exude out from a surface of the porous layer 43, with the surface of the porous layer 43 being adjacent to an evaporation room 44, and thus a surface wet with the water is formed on the surface of the porous layer 43.

Then, in the same manner as that of the present embodiment, the water which forms the wet surface is evaporated by adjusting a pressure in the evaporation chamber 44 by using a pressure adjustment device (not shown), and thus a temperature of a surface 42*a* of the susceptor 42 is adjusted by using latent heat of evaporation.

Even in the third modified example of the present embodiment, like in the present embodiment, since a temperature adjustment device which can reduce an installation space and simplify a configuration of the apparatus can be realized, a temperature of a temperature adjustment surface can be efficiently adjusted.

Also, in all of the above embodiment and modified examples of the present invention, when a substrate has a large diameter, a gradient temperature difference between an outlet of a cooling medium and an inlet of the cooling medium resulting from an increase in a length of a cooling medium passage can be simply suppressed by uniformly forming a wet surface.

According to the present invention, since a temperature adjustment unit which can reduce an installation space and simplify a configuration of an apparatus can be realized, a temperature of a temperature adjustment surface of a component member in a processing chamber can be efficiently adjusted to a predetermined temperature.

While the present invention has been particularly shown and described with reference to exemplary embodiments thereof, the present invention is not limited to these embodiments. It will be understood by those of ordinary skill in the art that various changes in form and details may be made therein without departing from the spirit and scope of the present invention as defined by the following claims.

What is claimed is:

1. A temperature adjustment method comprising:
    forming a wet surface wet with a cooling medium by supplying the cooling medium to a rear surface of a temperature adjustment surface of a component member in a processing chamber of a substrate processing device comprising the processing chamber which performs predetermined processing on a substrate and is vacuum-exhaustible; and
    adjusting a temperature of the temperature adjustment surface due to latent heat of evaporation of the cooling medium by evaporating the cooling medium which forms the wet surface by adjusting a pressure in an evaporation chamber which isolates the wet surface from an atmosphere around the wet surface,
    wherein the cooling medium is supplied to the rear surface by surface tension by making the rear surface as un uneven surface on which a plurality of convex portions are formed, and providing a cooling medium container which contains the cooling medium which is disposed in the evaporation chamber while the convex portions are partially immersed in the cooling medium container, or
    wherein the cooling medium is supplied to the rear surface by providing a plurality of shower devices in which an upper portion is attached to the rear surface, a middle portion is extended from the upper portion downward, a lower portion is extended side by side from the bottom of the middle portion, and the cooling medium is sprayed from a nozzle of the lower portion upward to wet the rear surface, or
    wherein the cooling medium is supplied to the rear surface by disposing a porous layer to contact the rear surface, water is supplied as the cooling medium from a water supply source to the porous layer to exude out from a surface of the porous layer, with the surface of the porous layer being adjacent to an evaporation room, and thus the wet surface wet with the water is formed on the surface of the porous layer.

2. The temperature adjustment method of claim 1, wherein the forming of the wet surface comprises controlling the temperature of the temperature adjustment surface based on the pressure in the evaporation chamber and/or an amount of the cooling medium supplied.

3. The temperature adjustment method of claim 2, wherein after the pressure in the evaporation chamber is set to a pressure lower than a saturated vapor pressure of the cooling medium, the amount of the cooling medium supplied is adjusted, thereby controlling the temperature of the temperature adjustment surface.

* * * * *